United States Patent
Garner et al.

(10) Patent No.: US 8,017,220 B2
(45) Date of Patent: Sep. 13, 2011

(54) ELECTRONIC DEVICE AND METHOD OF MAKING

(75) Inventors: Sean Matthew Garner, Elmira, NY (US); Gregory Scott Glaesemann, Corning, NY (US); Mark Lawrence Powley, Campbell, NY (US)

(73) Assignee: Corning Incorporated, Corning, NY (US)

(*) Notice: Subject to any disclaimer, the term of this patent is extended or adjusted under 35 U.S.C. 154(b) by 1078 days.

(21) Appl. No.: 11/888,169

(22) Filed: Jul. 31, 2007

(65) Prior Publication Data
US 2008/0085401 A1 Apr. 10, 2008

Related U.S. Application Data

(60) Provisional application No. 60/849,298, filed on Oct. 4, 2006.

(51) Int. Cl.
C09K 19/02 (2006.01)
B32B 17/00 (2006.01)
B32B 3/02 (2006.01)
B32B 5/00 (2006.01)

(52) U.S. Cl. .......................... 428/192; 428/1.1
(58) Field of Classification Search .................. None
See application file for complete search history.

(56) References Cited

U.S. PATENT DOCUMENTS

| | | | |
|---|---|---|---|
| 4,862,414 A | 8/1989 | Kuehnle | 365/106 |
| 5,824,127 A | 10/1998 | Bange et al. | 65/90 |
| 5,871,879 A | 2/1999 | Verlinden et al. | 430/155 |
| 6,092,392 A | 7/2000 | Verlinden et al. | 65/30.1 |
| 6,114,015 A * | 9/2000 | Fillion et al. | 428/192 |
| 6,355,125 B1 | 3/2002 | Tahon et al. | 156/99 |
| 6,358,767 B2 | 3/2002 | Eguchi | 438/30 |
| 6,502,423 B1 | 1/2003 | Ostendarp et al. | 65/29.14 |
| 6,612,910 B1 | 9/2003 | Hirano et al. | 451/41 |
| 6,789,298 B1 * | 9/2004 | Fillion et al. | 29/25.42 |
| 6,815,070 B1 * | 11/2004 | Burkle et al. | 428/425.6 |
| 6,975,067 B2 | 12/2005 | McCormick et al. | 313/512 |
| 7,018,703 B2 * | 3/2006 | Fillion et al. | 428/192 |
| 2003/0047353 A1 | 3/2003 | Yamaguchi et al. | 174/260 |
| 2003/0155151 A1 | 8/2003 | Hermanns et al. | 174/260 |
| 2003/0214612 A1 | 11/2003 | Freeman | 349/12 |
| 2004/0115852 A1 | 6/2004 | Park et al. | 438/30 |

(Continued)

FOREIGN PATENT DOCUMENTS

EP 0716339 A1 12/1996

(Continued)

OTHER PUBLICATIONS

Dictionary.com definition for substrate: http://dictionary.reference.com/browse/substrate (2009).*

(Continued)

*Primary Examiner* — David Sample
*Assistant Examiner* — Nicole Gugliotta
(74) *Attorney, Agent, or Firm* — Kevin M. Able

(57) ABSTRACT

Disclosed is an electronic device comprising a glass, glass ceramic, or ceramic sheet having a thickness less than about 0.4 mm and wherein a minimum strength of the inorganic substrate is greater than about 500 MPa. Also disclosed is a method of making an electronic device including drawing a viscous inorganic material to form an inorganic ribbon having opposing as-formed edges along a length of the ribbon, separating the ribbon to form a substrate sheet of inorganic material comprising two as-formed edges and forming a device element on the inorganic substrate.

13 Claims, 6 Drawing Sheets

U.S. PATENT DOCUMENTS

| | | | |
|---|---|---|---|
| 2004/0135503 A1 | 7/2004 | Handa et al. | 313/511 |
| 2004/0209126 A1 | 10/2004 | Ziegler et al. | 428/702 |
| 2005/0045900 A1 | 3/2005 | Silvernail | 257/99 |
| 2005/0051763 A1 | 3/2005 | Affinito et al. | 257/3 |
| 2005/0094394 A1 | 5/2005 | Padiyath et al. | 362/249 |
| 2005/0095736 A1 | 5/2005 | Padiyath et al. | 428/22 |
| 2005/0095945 A1 | 5/2005 | Chang et al. | 445/25 |
| 2005/0129841 A1 | 6/2005 | McCormick et al. | 427/66 |
| 2006/0003474 A1 | 1/2006 | Tyan et al. | 438/22 |
| 2006/0132735 A1 | 6/2006 | Lof et al. | 355/53 |
| 2008/0292856 A1* | 11/2008 | Garner et al. | 428/220 |

FOREIGN PATENT DOCUMENTS

| | | |
|---|---|---|
| EP | 0838723 A1 | 7/1997 |
| WO | WO2004/086530 A1 | 7/2004 |

OTHER PUBLICATIONS

Corning 0211 Microsheet Product Information Issued Jun. 2006.

\* cited by examiner

ELECTRONIC DEVICE AND METHOD OF MAKING

This application claims the benefit of priority under 35 U.S.C. §119(e) of U.S. Provisional Application Ser. No. 60/849,298 filed on Oct. 4, 2006.

BACKGROUND OF THE INVENTION

1. Field of the Invention

The present invention is directed to the manufacture of electronic devices, and in particular electronic devices formed using one or more thin flexible sheets of an inorganic material.

2. Description of Related Art

Display devices utilizing plasma, liquid crystal, or organic light emitting diode display elements, to name a few, are fast overcoming cathode ray tube (CRT) displays in commercial products, finding use in a myriad of applications, from cell phones to televisions. However, the introduction of very thin, light weight, or flexible displays is only in its infancy. This is due in no small part to the tremendous structural demands placed on such display devices: they must be capable of withstanding repeated flexing or bending or other stress without harm to the device or the substrate on which it is disposed; due to the intended use of thin, light, or flexible displays in portable devices, they are expected to withstand rough handling, again without undue harm to the device or substrate, and; they must be capable of withstanding impact or a bending radius that can be less than 2 cm, and less than 1 cm in some cases.

One material contemplated for use in thin, light weight, or flexible displays or electronic devices is glass. Glass is generally chemically resistant, transparent, can form a hermetic barrier or seal, can tolerate typical electronic fabrication temperatures, and may be formed into very thin sheets. Sheets in excess of 10 $m^2$ having thicknesses less than 1 mm, and even less than 0.7 mm have been produced and routinely used, and glass sheets are soon expected to reach dimension of at least about 100 $m^2$. In a typical display manufacturing process, multiple displays are formed using one or more large glass sheets or substrates. The displays are then separated into individual display units, usually by scoring and breaking or other cutting methods. Thus, very large glass sheets are efficiently utilized by producing as many display or electronic units as possible.

Cutting glass, and in this case glass sheets, generally forms flaws (e.g. cracks) in the edges of the glass sheets. These flaws can serve as crack initiation sites, and thereby reduce the strength of the sheets, particularly if the glass is flexed such that the flaw experiences tensile stress. Generally, typical display devices do not experience significant flexing, thus the existence of these flaws is not of significant concern: Typical cutting methods produce edges of sufficient strength to survive both the standard device processing conditions and current application end use.

Shown in FIG. 1 is a Weibull plot showing the failure probability for 75 micron thick glass sheets in four-point bending according to standardized four-point bending tests (e.g. ASTM). The samples in this case were 5 mm wide×30 mm long×75 microns thick. The samples were tested in a four-point bend arrangement standing on edge so the tensile stress was applied across the entire 75 um face thickness. The glass sheet represented by curves 10 and 12 were laser cut, while the glass sheet represented by curve 14 was mechanically scribed and separated by bending to fracture the sheet. As depicted, none of the samples represented by the curves showed a high probability of withstanding a stress in excess of about 300 MPa. The samples for mechanical scoring, the most widespread method of separating glass, did not show a high probability of withstanding a stress in excess of 100 MPa. Although standard cutting methods for glass substrates greater than 0.4 mm thick address the needs of current device manufacturing processes or application end use, higher edge strength is required for substrates less than 0.4 mm thick as may be used in emerging processes and applications such as flexible displays.

Flexible displays or flexible electronic devices, by the very nature of their flexibility, may produce significant stress in the display or electronic substrate(s), either during the manufacturing process or in use. Thus, flaws that might be present in the glass may experience stresses sufficiently great that the glass will crack, causing the glass to fail. Since typical display manufacturing involves cutting the glass to form individual displays, and cutting is known to create multiple flaws in the glass along the cut edge, this bodes poorly for the fate of glass substrate-based flexible display devices.

Attempts to mitigate flaws at the edges of glass sheets have included laser cutting, grinding, polishing and so forth, all in the attempt to remove or minimize the flaws that are created when the glass sheet is cut to size. However, many of these approaches are unsatisfactory for flexible electronic applications, either because the technique is incapable of removing flaws down to the size needed for the expected stresses, or the technique is difficult to apply to such thin glass sheets (less than about 0.4 mm thick) in a manufacturable process or scale. Acid etching of the glass edges may be used, but acid etching may also degrade the display or electronic device disposed on the substrate.

BRIEF SUMMARY OF THE INVENTION

In one embodiment of the present invention a method of making a display or electronic device is disclosed comprising providing a ribbon of inorganic material having opposing as-formed edges along a length of the ribbon, forming an electronic element on the ribbon, and separating the ribbon of inorganic material to form a sheet of inorganic material having opposed as-formed edges and an electronic element disposed thereon.

In another embodiment, an electronic device is described comprising a sheet of inorganic material comprising a thickness less than about 0.4 mm and at least two as-formed edges and at least one layer of an electroluminescent, semi-conducting or conducting material disposed over the glass sheet.

In still another embodiment, an electronic device is disclosed comprising a substrate comprising a glass sheet formed by a downdraw process, the glass sheet having a thickness less than about 0.4 mm and at least two as-formed edges in an opposed relationship, and an electrically active material disposed over the glass sheet.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings are not necessarily to scale, and sizes of various elements may be distorted for clarity. The drawings illustrate one or more embodiment(s) of the invention, and together with the description serve to explain the principles and operation of the invention.

DETAILED DESCRIPTION

Figure 1:
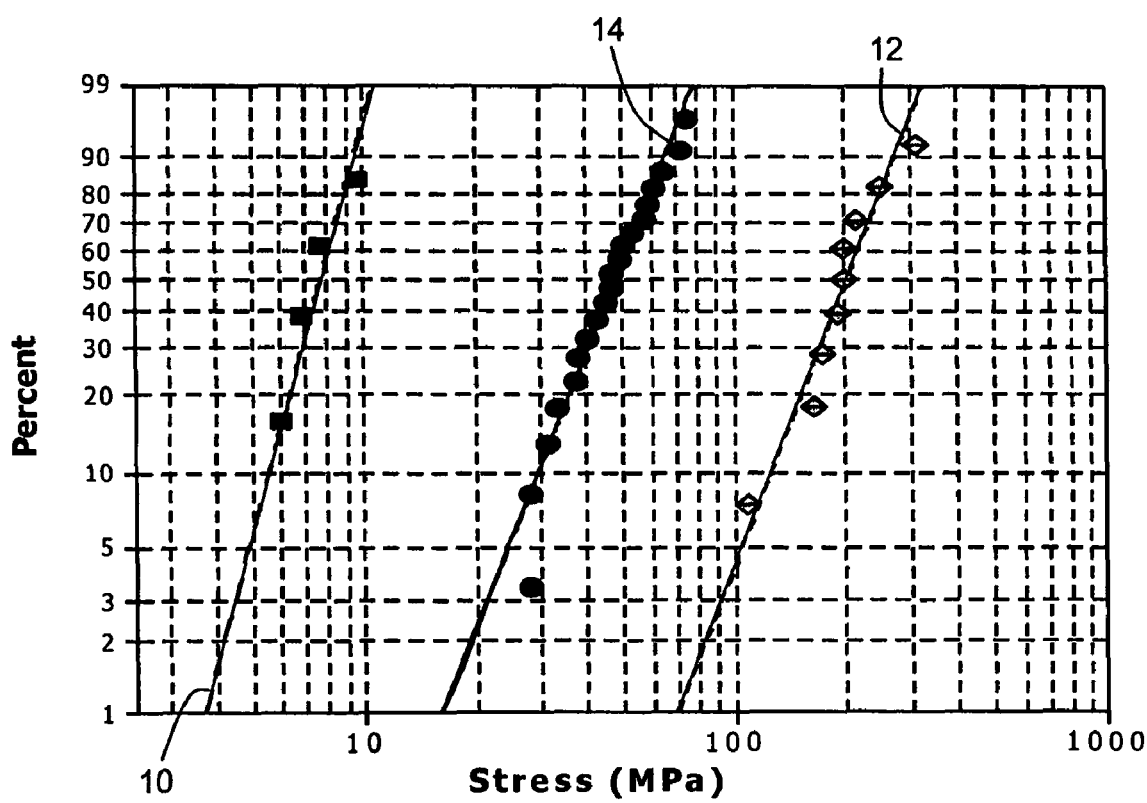
FIG. 1 is a plot of failure stress probability for glass samples separated (cut) by both mechanical scoring and laser cutting.

A conventional downdraw process for forming glass sheets may be, for example, a slot draw process, an overflow process, a fusion process or a redraw process. In a slot draw process, a molten raw material is drawn from a slot in the bottom of vessel containing the molten material. The dimensions of the resulting glass sheet are determined in part by the size and shape of the slot, the temperature/viscosity of the molten raw material, and the draw speed.

In a one-sided overflow process, the molten raw material is flowed over the upper edges of a long vessel or pipe. The finished glass sheet includes one side that has been in contact with the vessel, while the other side is relatively pristine, having not contacted the vessel sides during the overflowing.

In a variation of the overflow process, a molten raw material is flowed over both sides of a vessel or pipe having inclined sides that converge along the bottom of the vessel. The two separate flows rejoin along the line of convergence between the sides to form a single sheet which cools into a glass ribbon. The ribbon may thereafter be cut into smaller sheets.

Advantageously, the raw material from both streams of raw material that flow over and is in contact with the converging forming surfaces is joined in the center of the glass sheet, while the pristine surface of each flow becomes the outside surfaces of the glass sheet, providing a glass sheet of exceptional quality and clarity, making this so-called "fusion" process an ideal source of display glass.

For the purposes of simplicity, and not limitation, the following description is presented in terms of a re-draw process, with the understanding that the present invention is applicable to other methods of forming glass sheet less than 0.4 mm in thickness.

In a conventional re-draw process, a previously formed glass (i.e. a preform) is reheated above the softening point of the glass and stretched longitudinally (length-wise) and/or transversely (width-wise) to form a glass ribbon. The thickness of the ribbon and the width of the ribbon are dependent, inter alia, on the shape of the preform, the pulling force applied to the ribbon, and the viscosity of the glass. The preform may be, for example, a previously formed glass sheet made by any of the preceding processes, or any other process capable of producing a glass preform of the appropriate size and shape, such as a float process or soot consolidation process. Typically, the glass ribbon is drawn vertically downward, during which time the glass attenuates, both in thickness and width—the ribbon becomes thinner and narrower. The edges of the ribbon may be guided, or pulled with suitable rollers, but may also be untouched, with the pulling, or drawing force originating from the bottom of the glass sheet only. The as-drawn or as-formed edges are generally rounded due to surface tension at the still viscous edges, but may take other shapes, such as tapered or rectangular, depending on the process type and process parameters. For example, in a slot draw process, the shape of the slot and the viscosity of the glass may be varied to produce a generally tapered edge or more rectangular edge.

The strength of glass is dictated by the presence of flaws in the glass. If tensile stress is applied to glass having a flaw, the stress becomes concentrated at the flaw. A flaw may be a microscopic crack for example, in which case the stress is concentrated at the tip of the crack. If the stress exceeds a certain magnitude, the original flaw—the crack—may grow. If sufficient stress is applied, crack growth may be virtually instantaneous, leading to catastrophic failure of the glass: it breaks.

Analogous to the strength of a chain being based on the strength of the weakest link, the strength of glass may be characterized as the strength of the largest, and therefore weakest, flaw. For example, if a tensile stress of 10 kpsi (70 MPa) is applied to a glass fiber, and the fiber holds firm, the fiber is said to have a strength of at least 10 kpsi. That is, all the flaws that may exist on the glass fiber are smaller than that for which 10 kpsi would cause failure. As such, the "size" of a flaw in glass is often represented by stating the minimum tensile stress needed to cause catastrophic failure originating from that flaw. Thus, a glass fiber which has been stressed to 10 kpsi without breaking may be said to have no flaws "larger" than 10 kpsi in strength. While this representation of physical size by a stress with force units is a bit of a misnomer, the characterization of flaw size in terms of stress is common in the art of glass strength. This is due to the simple fact that flaw depth is nearly impossible to measure directly and the indirect "strength" of the flaw is used as a surrogate.

As can be appreciated by the preceding discussion, the strength of glass is a consequence of the history of the glass. That is, newly-formed pristine glass is inherently exceptionally strong. As-formed glass sheets can approach the strength of newly-formed glass fibers, typically in excess of 700 MPa. However, subsequent handling or exposure to environmental factors can create flaws, or enlarge existing flaws, thereby weakening the glass. For this reason, newly drawn optical fibers, for example, are immediately coated with a coating, such as a polymer coating, to protect the surface of the glass and prevent, or at least minimize, a degradation in strength. As used herein, the term "as-drawn" or "as-formed" will hereinafter refer to a glass edge which has not been scored, cut, abraded, or otherwise processed after the edge has been formed (that is, after the glass has cooled below its strain point and entered an elastic state where an applied load would deform the glass elastically). Any edge processing (shaping, cutting and so forth) that occurs while the glass sheet or ribbon temperature is above the strain point during processing is considered "as-formed" except localized edge heating and re-flowing which may occurs when an edge is processed, such as with a CO2 laser. It should be understood that this processing excludes routine contact with the glass, such as contacting the glass during transportation, exposure to air, moisture, etc.

In the context of a downdraw process, the edges of the glass are considered as-formed as they descend through a temperature gradient and transition from a viscous or viscous-elastic material to an elastic material. In a conventional glass sheet making process, the as-formed edges are removed after the glass cools below the strain point temperature, usually subsequent to the drawing process.

Figure 2:
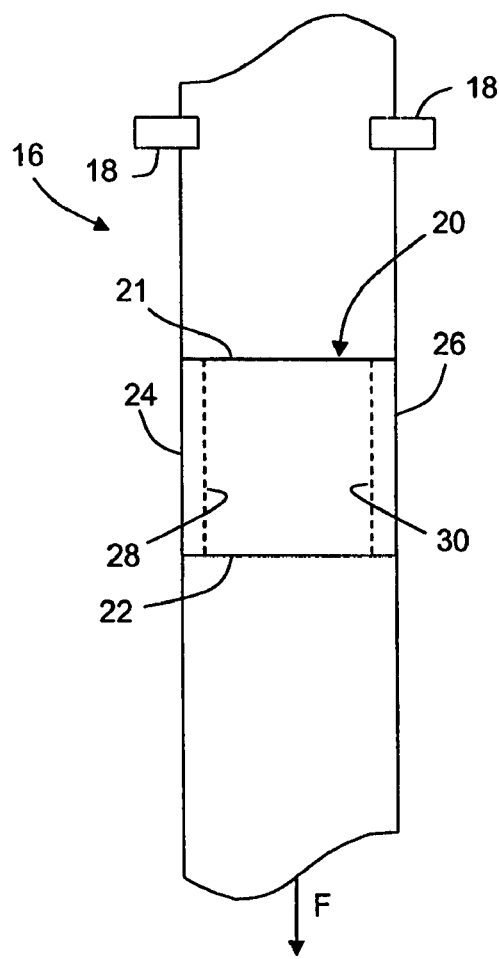
FIG. 2 is a front view of a portion of a downdraw glass sheet manufacturing process showing how individual glass sheets are typically cut from the drawn ribbon of glass.

Shown in FIG. 2 is a glass ribbon 16 descending from a source (not shown). Glass ribbon 16 may be drawn by applying a force F to the bottom end of the ribbon. Alternatively, counter-rotating pairs of pulling rolls 18 at each edge of ribbon 16 may be used to draw the glass. The source may be a re-draw process, a single-sided overflow downdraw process, a two-sided fusion downdraw process or any other process wherein a viscous melt is drawn into a glass ribbon. In a conventional glass sheet forming operation, glass sheet 20 is cut from ribbon 16 along separation lines 21 and 22. As-drawn edge portions 24 and 26 are removed, forming separation edges 28 and 30, usually subsequent to the drawing process. Glass sheet 20 may then be used in a later display or electronic device manufacturing process.

Figure 3:
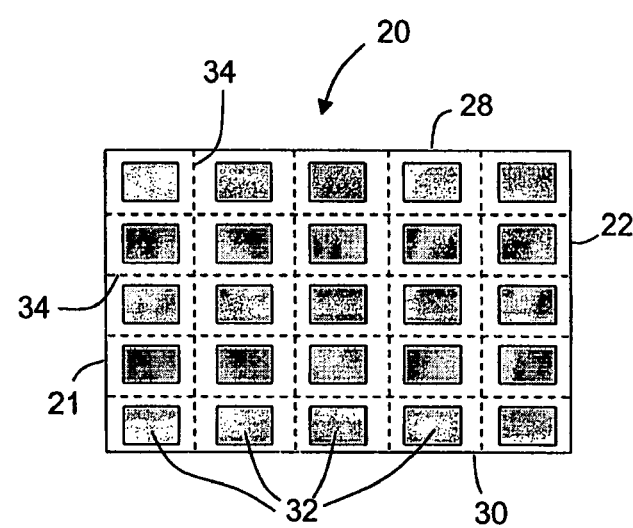
FIG. 3 is a top view of an intermediate display manufacture showing display elements arranged on a glass sheet or substrate before the individual devices are separated from the parent sheet.

Economies of scale are typically realized in an electronic device manufacturing process by forming as many devices on a substrate sheet as can be practically made to fit. Thus, as illustrated in FIG. 3, as many electronic device elements 32 (e.g. display elements 32) may be formed on glass sheet 20 as may fit. Device elements 32 may be, for example, one or more layers of an electrically active or inactive material, or an electroluminescent material such as an organic light emitting diode (OLED) material. A device element may be, for example, one or more pixels of a larger display device, an electroluminescent material, etc. Glass sheet 20, comprising a plurality of electronic device elements 32 is then further cut, such as along separation lines 34, to produce individual electronic devices. For example, glass sheet 20 may comprise multiple sets of device elements 32. Glass sheet 20 is then be separated or subdivided such that each set of device elements 32 comprises an individual display unit that may be incorporated into a more complex assembly, such as a computer monitor, television, cell phone, etc. The following description is directed primarily toward such display devices. However, it should be recognized that the following disclosure is applicable to other electronic devices. As used herein, an electronic device is intended to denote any of a broad category of devices and assemblies including, but not limited to, display devices, photovoltaic devices, radio frequency identification (RFID) devices, silicon semi-conducting devices, organic semi-conducting devices and other general electronic devices. On the other hand, an electronic device element is intended to denote a singular component or set of components of any one of the foregoing devices or assemblies.

It should be readily apparent from the foregoing description that an individual electronic device resulting from the above process includes a separation edge on each side of the display. Generally, display devices are rectangular in shape, and thus the display resulting from the above process would include four separation edges created subsequent to the drawing process. That is, the entire perimeter of the display device would consist of separation edges, and likely include flaws of varying sizes and tensile strengths. In the case of a flexible electronic device which may be required to endure significant bending stresses, the probability of failure due to fracture of the device is heightened by the presence of the separation edges, since no matter what the direction of bending, a separation edge will be flexed or stressed. The present invention takes advantage of the high strength obtained from the as-formed edges of the ribbon, and a sheet cut from the ribbon.

As used herein, the general term "glass" is used to refer to the substrate material, but the substrate material is meant to include any of a broad class of brittle inorganic materials comprising glasses, glass ceramics, and ceramics that can be formed from a viscous state. For example, a glass ceramic substrate can possess high strength as-formed edges that are created when drawn from a viscous state before undergoing the crystallization step. Likewise, the substrate may be comprised of one or more inorganic layers at least one of which possesses as-formed edges. The substrate additionally may include a protective polymeric or other layer along with the at least one inorganic layer with as-formed edges.

In some embodiments of the present invention, the as-formed edges of the glass are contacted by pulling rolls that draw the glass downward, but that deform the glass edges with which they are in contact at a temperature above the glass strain point. Indeed, in some embodiments the rolls may be used less for pulling and more for imparting a shape to the ribbon edges, for example a taper, or a glass web extending from the sheet edge along the length of the ribbon, preferably down the center of the edge thickness (the neutral plane of the ribbon). Other methods of shaping the as-drawn glass edges are also possible, such as with a laser, pressurized gas, or other methods.

Figure 4:
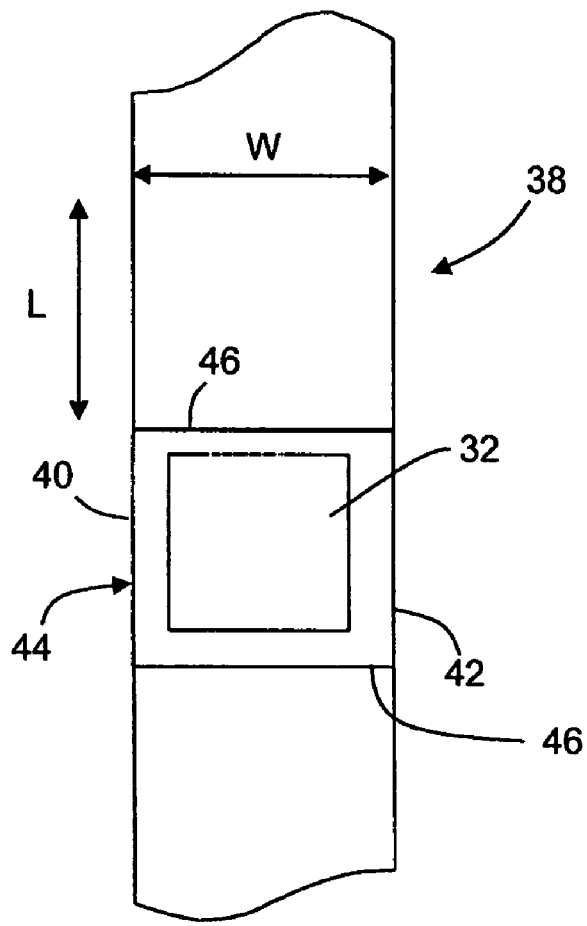
FIG. 4 is a front view of a portion of a downdraw glass sheet manufacturing process showing how individual glass sheets are typically cut from the drawn ribbon of glass in accordance with an embodiment of the present invention.

In accordance with one embodiment, pulling rolls are not employed, and the as-drawn edges of the drawn ribbon are not removed. Depicted in FIG. 4 is a ribbon that may be formed much as that described relative to FIG. 1, with the exception that the as-drawn edges are not removed. Glass ribbon 38 may for example be rolled and stored for later use. In any event, glass ribbon 38 comprises a long dimension L (length L) generally parallel to the as-drawn edges 40 and 42, and a width W transverse to the length. Length L may vary with the particular process.

Width W of ribbon 38 is sized such that an electronic device element 32 may be formed across the width of the ribbon. Thus, electronic device elements may be formed on glass ribbon 38 in a manner analogous to the manner in which images are sequentially formed on a strip of photographic film, such that ribbon 38 need only be separated along one dimension to form an individual electronic device, e.g. a display device. The electronic device element or elements typically comprise at least one layer of an electroluminescent, semi-conducting or conducting material. For example, the device element may be an organic light emitting material. Either before, or subsequent to, the formation of the one or more display or electronic device elements 32 on glass ribbon 38, individual display or electronic device substrates 44 are cut from the ribbon along separation lines 46. For example, individual device substrates 44 can be separated from glass ribbon 38 in a manner that retains the as-formed edges 40 and 42 before a device element 32 is fabricated. Likewise, it is also possible to first fabricate a device element 32 on the substrate 44 while it is still attached to the remaining glass ribbon 38. The first approach is suitable for batch processing of devices, and the second approach is suitable for continuous or roll-to-roll processing of devices. In both cases, the as-formed edges 40 and 42 of device substrate 44 are retained.

Specific examples described herein have dealt with display devices and flexible display devices in particular. Moreover, the high strength substrate with as-formed edges can be used for several types of display devices such as organic light emitting, electrophoretic, liquid crystal and electro-wetting devices. In general, though, thin glass substrates with high strength as-formed edges can be used for other electronic device applications outside of the display area. Such devices may be comprised of a single substrate with as-formed edges or multiple substrates with as-formed edges (top & bottom, backplane and color filter, backplane and encapsulating cover and so forth).

Likewise, although the term "flexible" is generally used to describe the glass substrate, the substrate need not be flexed either during the final application or during the device manufacturing process. The term "flexible" is used to point out that the substrate is thin enough and has a high enough strength to survive bend radii less than about 30 cm, less than about 10 cm, less than about 5 cm, less than about 2 cm, or less than about 1 cm. For example, the final application for an electronic device fabricated on a high strength substrate with as-formed edges may require properties of thinness and light weight. This application would require a mechanically durable substrate, but bending may not occur in either the final use or a manufacturing process therefor. Alternatively, a continuous or semi-continuous manufacturing process could be used to fabricate the electronic devices, thus potentially requiring the substrate to experience a bend radius. In this case the final application may not require flexing of the substrate, but a cost effective manufacturing process could. A final example is with the end application requiring the substrate to experience either a short term or long term bend radius. Devices may be manufactured for a flexible or conformable application in either a continuous or flat batch process.

Figure 5:
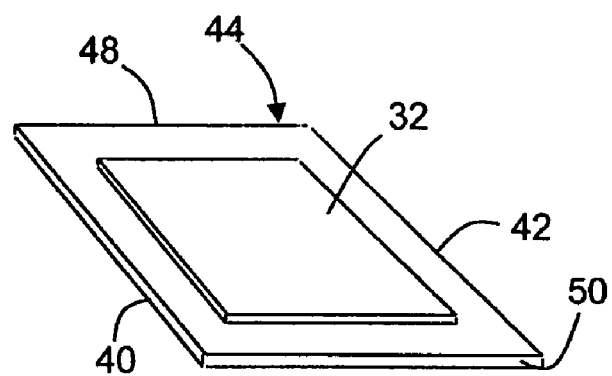
FIG. 5 is a perspective view of a display or electronic device formed in accordance with an embodiment of the present invention.

When an individual display or other electronic device is cut from the ribbon, the underlying glass sheet or substrate is generally rectangular in shape, with two sets of two opposing edges: a first pair of cut or separation edges, and the second pair of un-cut, as-drawn edges. The glass sheet has a thickness preferably less than or equal to 0.4 mm, preferably less than or equal to 100 μm. The as-formed edges can have a tensile strength greater than about 500 MPa. On the other hand, the tensile strength of the separation edges is considerably weaker, in some cases less than about 200 MPa, the edge having been damaged during the separation operation (e.g. by scoring and breaking). Thus, the strength of the entire sheet is compromised by the low strength of the edges, i.e. the strength of the edges establishes the maximum strength of the entire sheet. One such resulting electronic device 44 is shown in FIG. 5. Electronic device 44 comprises two as-formed edges 40 and 42, and two separation edges 48, 50 resulting from the separation from ribbon 38. Electronic device 44 may be a display device, or any other device as disclosed herein.

Figure 6:
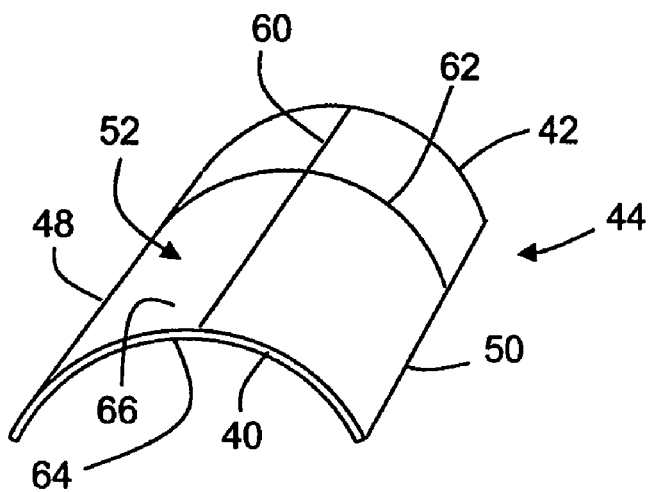
FIG. 6 is a perspective view of a bending mode for a display or electronic device made in accordance with an embodiment of the present invention.

Consider FIG. 6 showing glass substrate-based display or electronic device 44 comprising glass sheet 52 having separation edges 48, 50 and opposing as-drawn edges 40, 42 (display or electronic device element 32 has been omitted from view for clarity) on glass sheet 52. Orthogonal axes 60 and 62 are shown superimposed on the glass sheet such that axis 60 is perpendicular to and intersects as-drawn edges 40 and 42, and axis 62 that is perpendicular to and intersects separation edges 48 and 50. It should be apparent that axes 60 or 62 need not bisect their respective edges, nor is it necessary that they be perpendicular, either to themselves or to their respective edges. That is, bending is not necessarily perpendicular to any one edge. However, the representation presented here is illustrative.

Figure 7:
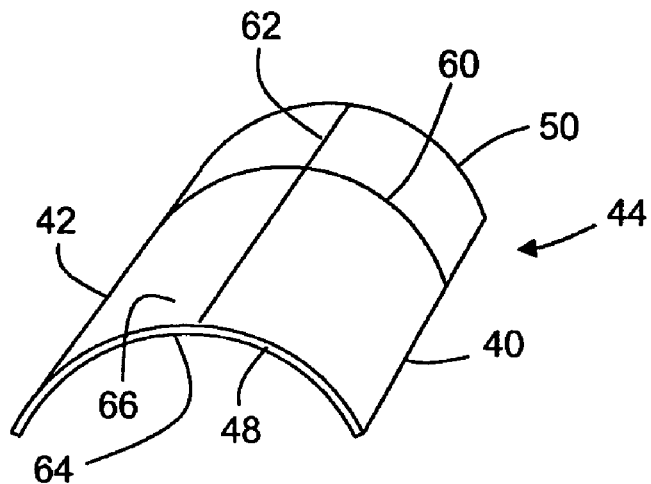
FIG. 7 is a perspective view of another bending mode for a display or electronic device made in accordance with an embodiment of the present invention.

If glass sheet 52 is bent in a manner that forms a generally "U" shape with axis 60 running along the top of the U-shaped curve, separation edges 48, 50 are not bent, and experience no externally-applied tensile stress. On the other hand, as-formed edges 40 and 42 are bent. Because edges 40 and 42 are the as-formed edges and possess high strength, the sheet is less likely to fracture. If, however, the sheet 52 is instead bent orthogonal to axis 60 such that axis 62 runs along the top of the U-shaped curve as shown in FIG. 7, separation edges 48, 50 are subjected to stress—compression stress at surface 64 and tensile stress at surface 66. If the bend is sufficiently tight (having a small bend radius), and the flaws produced at edges 48, 50 by the separation/cutting process are of a strength lower than the applied tensile stress, the sheet can fracture.

There are many applications contemplated for flexible displays or electronic devices where just such bending may be experienced. For example, the flexible display or electronic device may be in the form of a roll or coil that is uncoiled for viewing, then re-coiled for storage. If the flaw-prone separation edges of the device are parallel with the axis of the coil, the separation edges will experience minimal stress. Stresses resulting from the bending are instead borne by the high-strength as-formed edges. Additionally the device may be bent once during installation and held at that bend radius continuously throughout its lifetime. This also requires a high strength continuously bent edge due to the well-known phenomenon of glass fatigue. Continuous, semi-continuous, or batch manufacturing processes may also require large tensile or other strength requirements along the as-formed edges.

Figure 8:
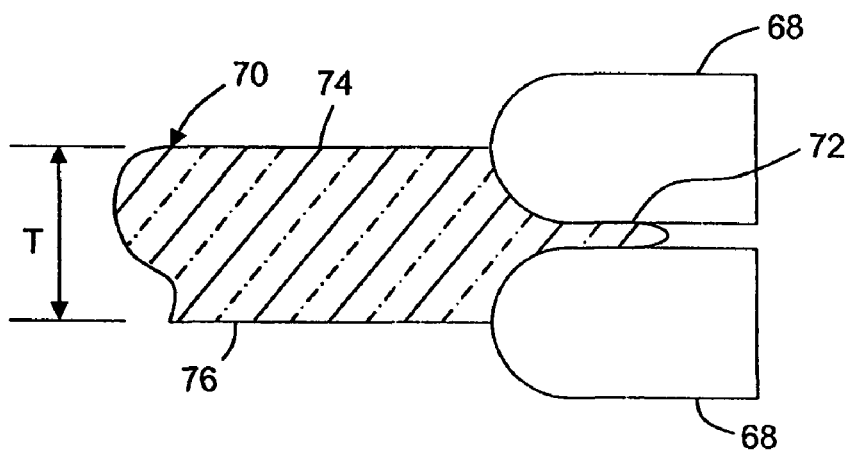
FIG. 8 is a cross sectional view showing how a ridge is formed at an edge of a glass ribbon in accordance with an embodiment of the present invention.

Shown in FIG. 8 is another embodiment of the present invention wherein a tapered shape has been imparted to the as-formed edges of a glass ribbon, such as by paired rolls 68. As shown, the extreme edge of glass ribbon 70 is substantially thinner than the remainder of the ribbon. For example, the edge may comprise a thin ridge 72 of glass that extends from the body of the ribbon midway between the front and back surfaces 74, 76 respectively, of the ribbon and extending along the length of the ribbon.

Figure 9:
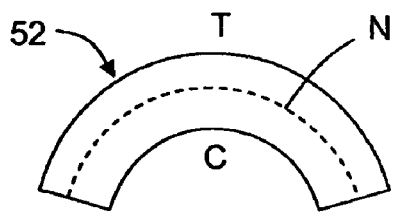
FIG. 9 is a cross sectional view of a glass sheet bent into a "U" shape and illustrating the location of the tensile, neutral and compressive stress regions.

As a glass object, such as glass sheet 52 is bent, two stress zones are formed—a compression zone C and a tensile zone T. As shown in FIG. 9, the tensile zone forms at the outside of the bend, whereas the compression zone forms at the inside of the bend. As one moves from the outside to the inside, the tensile stress in the tensile stress zone gradually decreases, passes through zero, and becomes a compressive stress. That is, as one moves through the thickness of the glass sheet, the stress transitions from tensile to compressive, or compressive to tensile. The stress midway between the two surfaces is zero, and may be referred to as the neutral plane N. Glass fails under stress (tensile), and if the ridge region described supra is formed along the neutral plane of the sheet, flaws existing at the ridge are less likely to serve as the source of failure because the stress is minimal at this location.

Figure 10:
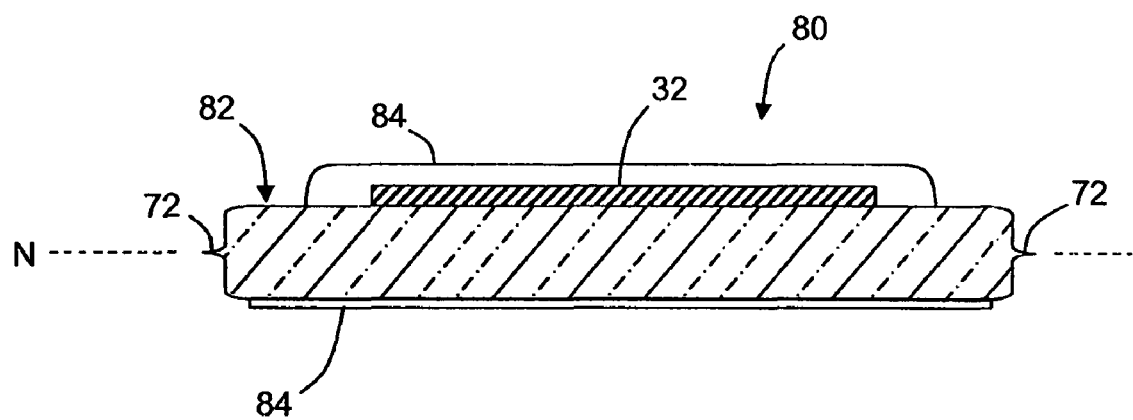
FIG. 10 is a cross sectional view of a display or electronic device in accordance with an embodiment of the present invention showing ridges in the neutral plane of as-drawn edges.

Shown in FIG. 10 is a cross sectional view of an exemplary electronic device 80, e.g. a display device, in accordance with an embodiment of the present invention comprising glass sheet 82 separated from ribbon 70. The as-formed edges are shown to the right and left hand side of FIG. 10, whereas the separation edges are into and out of the page. An electronic device element 32, such as an electroluminescent, semi-conducting, or conducting material (e.g. organic light emitting material, silicon (Si), or indium tin oxide (ITO) coating) is disposed over glass sheet 82. Device 80 may also include one or more barrier layers 84 that provides a hermetic seal with glass sheet 82 and thus a hermetic package for device element 32. The barrier layer may be formed overtop of electronic device element 32 or beneath device element 32 (between glass sheet 82 and device element 32) or disposed opposite glass sheet 82 from device element 32. Barrier layer 84 may be, for example, a glass layer, a polymer layer or any other material capable of providing hermeticity. Glass sheet 82 is shown comprising edge ridges 72 disposed along neutral plane N of glass sheet 82. Ridges 72 may be formed, for example, by rollers during any of the previously described downdraw processes, as illustrated in FIG. 8. As should be apparent from the preceding example (i.e. FIG. 9), bending display 80 (e.g. glass sheet 82) such that ridges 72 are non-planar, for example, in a "U" shaped bend as illustrated in FIG. 9, the ridges experience little stress, being located along the neutral plane of the glass sheet. Thus, even if damaged, the as-drawn edges comprising ridges 72 are unlikely to precipitate a fracture.

Figure 11:
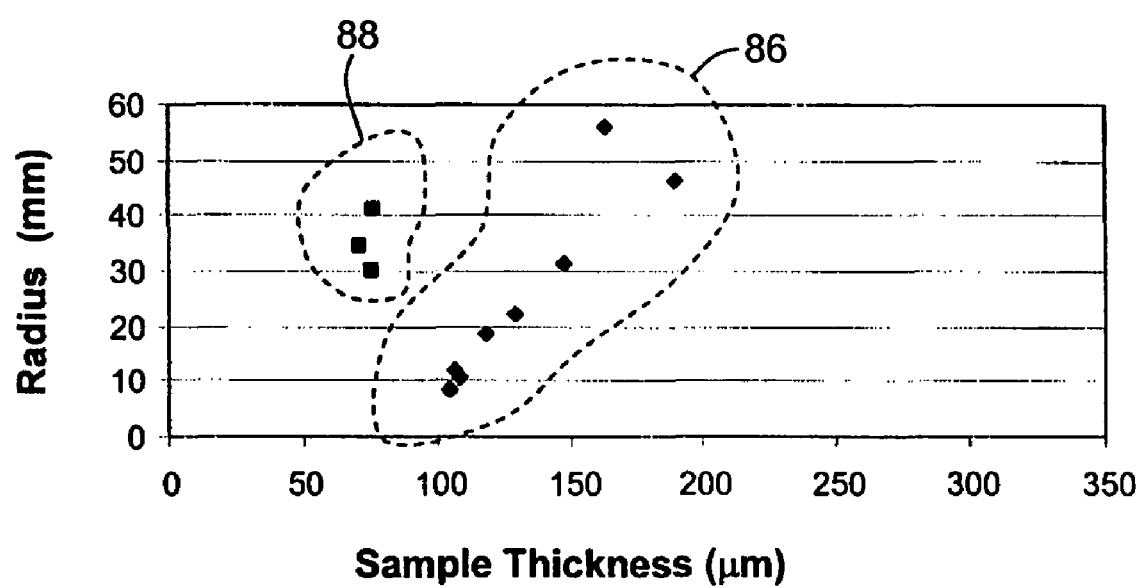
FIG. 11 is a plot of the minimum bend radius at failure for multiple samples of two different types of glass sheets, showing the superior performance of the samples having as-drawn edges.

To illustrate an embodiment of the invention, a Corning code 1737G glass sheet was cut to appropriate dimensions as a preform in a redraw process. The preform was redrawn and the resultant glass ribbon was cut into 40 mm lengths while preserving the as-drawn edges. The 40 mm long samples were bent into a "U" shape between two moving parallel plates to test the two-point bend strength of the as-formed edges. Two point bend testing is a common method of testing the strength of glass articles, including glass fibers. A sample is placed between two fixtures in a "U" shape and one or both of the fixtures moved together. The size of the glass article and the distance between the fixtures (e.g. the bend radius of the article) can be used to determine the tensile stress experienced by the article at failure. See, for example, Telecommunications Industry Association Bulletin no. TSB62-13. The plates were moved together at a closure rate of 0.1 mm/s until the sample failed (broke). The results of that test are shown in FIG. 11. FIG. 11 depicts data points for the minimum bend radius achieved for each sample as a function of the sample thickness. The 1737G samples (86) were able to achieve a minimum bend radius of less than 30 mm in many cases, and in some cases, less than 20 mm, and in other cases less than 10 mm. The same test was also performed on Corning 0211 Microsheet glass sized by laser cutting and plotted on in FIG. 11 (88). FIG. 11 shows that even though the 0211 Microsheet samples were thinner than the redrawn 1737G sample, many of the 1737G samples were able to achieve a much smaller bend radius before failure than the 0211 Microsheet sample. The minimum achievable bend radius before failure for the 0211 Microsheet samples was 30 mm.

In another experiment, Corning Eagle2000F™ glass sheets were cut to size and redrawn to glass sheets having dimensions of approximately 0.4 mm wide by 40 μm thick by 50 cm long. The redrawn samples were then strength tested in tension to failure at a rate of approximately 180 MPa/s in air. The median recorded strength was approximately 1000 MPa.

While the invention has been described in conjunction with specific exemplary embodiments thereof, it is evident that many alternatives, modifications, and variations will be apparent to those skilled in the art in light of the foregoing description. Accordingly, the present invention is intended to embrace all such alternatives, modifications, and variations as fall within the spirit and broad scope of the appended claims.

What is claimed is:

1. An electronic device comprising:
    a sheet of inorganic material comprising a first surface, a second surface, and a thickness therebetween less than about 0.4 mm, the sheet of inorganic material further comprising at least two as-formed edges, each of the as-formed edges further comprising a ridge formed from the inorganic material positioned between the first surface and the second surface and extending outward from each as-formed edge; and
    at least one layer of an electroluminescent, semi-conducting, or conducting material disposed over the inorganic sheet of inorganic material.

2. The electronic device according to claim 1 wherein the sheet of inorganic material comprises a glass, a glass ceramic or a ceramic material.

3. The electronic device according to claim 1 wherein a minimum tensile strength of the sheet of inorganic material is at least about 500 MPa.

4. The electronic device according to claim 1 wherein the thickness of the sheet of inorganic material is less than about 200 μm.

5. The electronic device according to claim 1 wherein the sheet of inorganic material is coated with a polymer.

6. The electronic device according to claim 1 wherein a minimum bend radius before fracture of the sheet of inorganic material in a two-point bending test at a closure rate of 0.1 mm/s is less than 30 mm.

7. The electronic device according to claim 1 wherein the electroluminescent, semi-conducting, or conducting material is an organic material.

8. An electronic device comprising:
    a substrate comprising a glass sheet formed by a downdraw process, the glass sheet having a first surface, a second surface, and a thickness therebetween less than about 0.4 mm, the glass sheet further comprising at least two as-formed edges in an opposed relationship, each of the as-formed edges further comprising a ridge formed from the glass of the glass sheet positioned between the first surface and the second surface and extending outward from each as-formed edge alone a length of the glass sheet; and
    an electrically active material disposed over the glass sheet.

9. The electronic device according to claim 8 wherein the thickness is less than about 0.2 mm.

10. The electronic device according to claim 8 wherein a tensile strength of the glass sheet along the as-formed edges is greater than about 500 MPa.

11. The electronic device according to claim 8 wherein the electronic device is an electroluminescent display device, a liquid crystal display device, an electrophoretic display device, or an electro-wetting display device.

12. The electronic device according to claim 8 wherein the electronic device is a photovoltaic device, a radio frequency identification device, or a lighting device.

13. The electronic device according to claim 8 wherein the substrate comprises a plurality of layers, at least one of the layers having at least two as-formed edges.

* * * * *